United States Patent [19]

Toshiyasu et al.

[11] Patent Number: 4,943,755
[45] Date of Patent: Jul. 24, 1990

[54] MAGNETIC SHIELDING WITH CONSTANT-CURRENT COILS FOR CRT

[75] Inventors: Masayuki Toshiyasu; Kazuhiro Chihara; Yasuo Iwasaki, all of Kyoto, Japan

[73] Assignee: Mitsubishi Denki Kabushiki Kaisha, Tokyo, Japan

[21] Appl. No.: 864,659

[22] Filed: May 19, 1986

[30] Foreign Application Priority Data

May 20, 1985 [JP] Japan .................. 60-107294
Jun. 17, 1985 [JP] Japan .................. 60-133758

[51] Int. Cl.⁵ .................. H04N 9/29; H01J 29/06
[52] U.S. Cl. .................. 315/8; 361/150
[58] Field of Search .............. 315/3, 8, 364; 358/245; 361/149, 150, 151, 267

[56] References Cited

U.S. PATENT DOCUMENTS

| | | | |
|---|---|---|---|
| 2,921,226 | 1/1960 | Vasilevskis | 315/8 |
| 3,322,998 | 5/1967 | Norley | 315/8 |
| 3,324,343 | 6/1967 | Norley | 315/8 |
| 3,340,417 | 9/1967 | Panis et al. | 315/8 |
| 3,443,138 | 5/1969 | Schwartz | 315/8 |
| 3,867,668 | 2/1975 | Shrader | 315/8 |
| 4,556,821 | 12/1985 | Cooper | 315/8 |

FOREIGN PATENT DOCUMENTS

| | | | |
|---|---|---|---|
| 55-30277 | 3/1980 | Japan | 315/8 |
| 56-14789 | 2/1981 | Japan | 315/8 |
| 57-58488 | 4/1982 | Japan | 315/8 |
| 527892 | 10/1940 | United Kingdom . | |
| 777084 | 6/1957 | United Kingdom . | |
| 1109103 | 4/1968 | United Kingdom . | |
| 1252201 | 11/1971 | United Kingdom . | |
| 1301955 | 1/1973 | United Kingdom . | |
| 1553276 | 9/1979 | United Kingdom . | |

OTHER PUBLICATIONS

European Search Report dated Aug. 13, 1986—#8612125.

Primary Examiner—James J. Groody
Assistant Examiner—Mark R. Powell
Attorney, Agent, or Firm—Sughrue, Mion, Zinn, Macpeak & Seas

[57] ABSTRACT

A magnetic shielding for a cathode ray tube. A magnetic shielding case surrounds the CRT funnel and side portions of the CRT front panel. Additionally a current coil is wrapped around the CRT. In one embodiment, the coil is wrapped completely inside the shielding case. In another embodiment, the coil is wrapped partially inside the shielding case and partially outside.

10 Claims, 4 Drawing Sheets

MAGNETIC SHIELDING WITH CONSTANT-CURRENT COILS FOR CRT

BACKGROUND OF THE INVENTION

1. Field of the Invention

The present invention generally relates to color television receivers, and particularly relates to a magnetic shielding system in a color television receiver including a combination of magnetic shielding and magnetic cancelling as measures to counter external magnetism, particularly applicable to an extra large color cathode ray tube in a high-definition television.

2. Description of the Prior Art

In order to counteract undesirable external magnetic disturbances such as geo-magnetism, or the like, a color cathode ray tube 1 (hereinafter abbreviated to CRT), as generally used today, often includes an internal magnetic shield 1b (hereinafter abbreviated to "IMS") connected to a shadow mask 1a as shown in FIG. 1A. Generally, the IMS 1b is composed of iron plates and arranged to cooperate with a magnetic erasing coil (not-shown) provided outside the color CRT 1 to provide a magnetic shielding effect so as to make an external magnetic field hardly influence the electron beams in the color CRT 1. As a measure to counteract external magnetism for a color CRT, however, there had been used, as shown in FIG. 1B, an external magnetic shield 6 (hereinafter abbreviated to "EMS") of the type provided outside the color CRT 1. The EMS 6 is fixed to the CRT 1 by utilizing the holes of fittings 7 attached to the color CRT 1. The EMS system had been used prior to the widespread use of the so-called IMS system employing the above-mentioned IMS 1b. In each of FIGS. 1A and 1B is shown a deflecting yoke 5. The EMS 6 covers the major part of a funnel 1F of the color CRT 1 but does not cover the major part of a forward panel 1P, so that the magnetic shielding effect is insufficient. In addition to its insufficient magnetic shielding effect, the EMS system is not only bulky in the color television receiver but is high in cost and troublesome to assemble. As a result, the EMS system has gradually fallen out of use, and, at present, the IMS system shown in FIG. 1A is widely used in it place.

Recently, a desire to enlarge color CRTs has become intense, particularly for high-definition television receivers, e.g., CRTs of about 40 inches have been developed. As color CRTs are made large in size, the propagation distance of electronic beams between an electron gun and a screen in the respective CRT becomes extremely large so as to make it very difficult to counteract external magnetism. FIG. 2 is a diagram for explaining the relationship between the kind of magnetic shielding system and the travelling distance of electron beams in a 37 inch color CRT having a deflection of 110 degrees. In FIG. 2, the distance of shift in incidence of electron beam in the horizontal direction on a fluorescent screen at a corner of a picture screen is plotted when an external magnetic field is changed by 0.8 gauss. The reason why the quantity of horizontal shift of electron beams is shown in FIG. 2 is that the fluorescent screen of the 37-inch 110 deflection color CRT is assumed to have a stripe structure. However, not only the quantity of horizontal shift of electron beams, but the distance of vertical shift of the beam must be considered in the case where the color CRT has a dot structure. Nonetheless, the discussion below will be limited to the case of the color CRT having a stripe structure. In FIG. 2, the symbol E/W designates a magnetic field in the direction of east and west, N/S a magnetic field in the direction of south and north, and BV a magnetic field in the vertical direction, as defined by the enclosed perspective view of the CRT 1. In FIG. 2, it is apparent that the non-IMS and non-EMS system having neither IMS nor EMS cannot be used because the shift distance of an electron beam is extremely large except in the E/W direction.

Similarly, in FIG. 2, in the conventional IMS system of the color CRT 1 in the color television receiver, the shift distance of the electron beams has been considerably suppressed but does not fall below 150 micrometers, which is the threshold in practical use. This threshold is indicated by a wavy line in FIG. 2. The threshold of shift distance is different depending on the kind of color CRT 1. For example, in the 37-inch 110 deflection color CRT, the above-mentioned threshold (150 micrometers) of shift distance is a value which may be a standard for judging whether the color CRT can be used practically or not. Accordingly, the problem still exists in the EMS system shown in FIG. 1B such that the EMS system can not be practically used because the shift distance of the electronic beams is larger even than that in the IMS system shown in FIG. 1B.

SUMMARY OF THE INVENTION

An object of the present invention is to provide a magnetic shielding system for a large-sized CRT in a color television receiver, in which a practical counter measure to an external magnetic field is provided to reduce a shift distance of electron beams, resulting from spurious magnetic fields, to thereby obviate color shading.

According to the present invention, the magnetic shielding system for a color television receiver includes an external-magnetism shielding plate outside a color CRT so as to cover a funnel portion of the color CRT and most of the side surfaces of a panel portion of the color CRT. It further includes a magnetic cancelling coil interposed between the external-magnetism shielding plate and the color CRT. Thereby the shift distance of electron beams due to an external magnetic field is reduced. The magnetic cancelling coil is excited with a DC current to reduce the magnetism exceeding the threshold of the shift distance of electron beams, whereby the quantity of shift of electron beams is suppressed to a value below the threshold against external magnetic fields in any direction.

DETAILED DESCRIPTION OF PREFERRED EMBODIMENTS

Figure 1A:
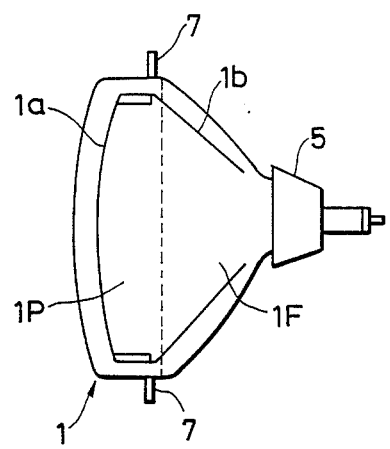
FIGS. 1A and 1B are views illustrating conventional magnetic shielding systems for color cathode ray tubes.
Figure 1B:
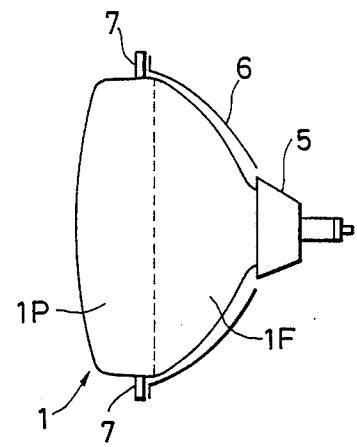
Figure 3A:
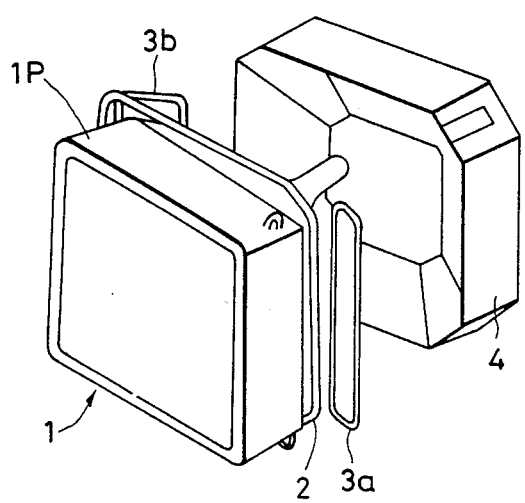
FIG. 3A is a perspective view showing an embodiment of the magnetic shielding system in a color television receiver according to the present invention.
Figure 3B:
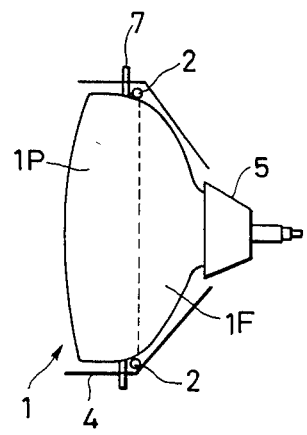
FIG. 3B is a schematic side cross-section of the magnetic shielding system of FIG. 3A.

In FIGS. 3A and 3B, a color CRT 1 has a funnel portion 1F and a panel portion 1P. The color CRT 1 is provided with an external magnetic shielding system, that is, an EMS 4, shown in FIG. 3B which is arranged to cover most of the funnel portion 1F and to cover the sides of the panel portion 1P. Unlike the EMS 6 shown in FIG. 1B, the EMS 4 of this embodiment is arranged so as to be extended considerably to the front of the color CRT 1 as shown in FIG. 3B to cover not only the funnel portion 1F but the most of the panel portion 1P. In addition, a magnetic cancelling coil 2 cancels an external magnetic field in the N/S direction and, if necessary, a pair of magnetic cancelling coil 3a and 3b cancel an external magnetic field in the E/W direction. All the magnetic coils 2, 3a and 3b are placed between the color CRT 1 and the EMS 4. In FIG. 3B, the pair of magnetic cancelling coils 3a and 3b are omitted for simplification of the drawing. The color CRT 1 is provided with a deflection yoke 5 and fixed by fittings 7.

Figure 2:
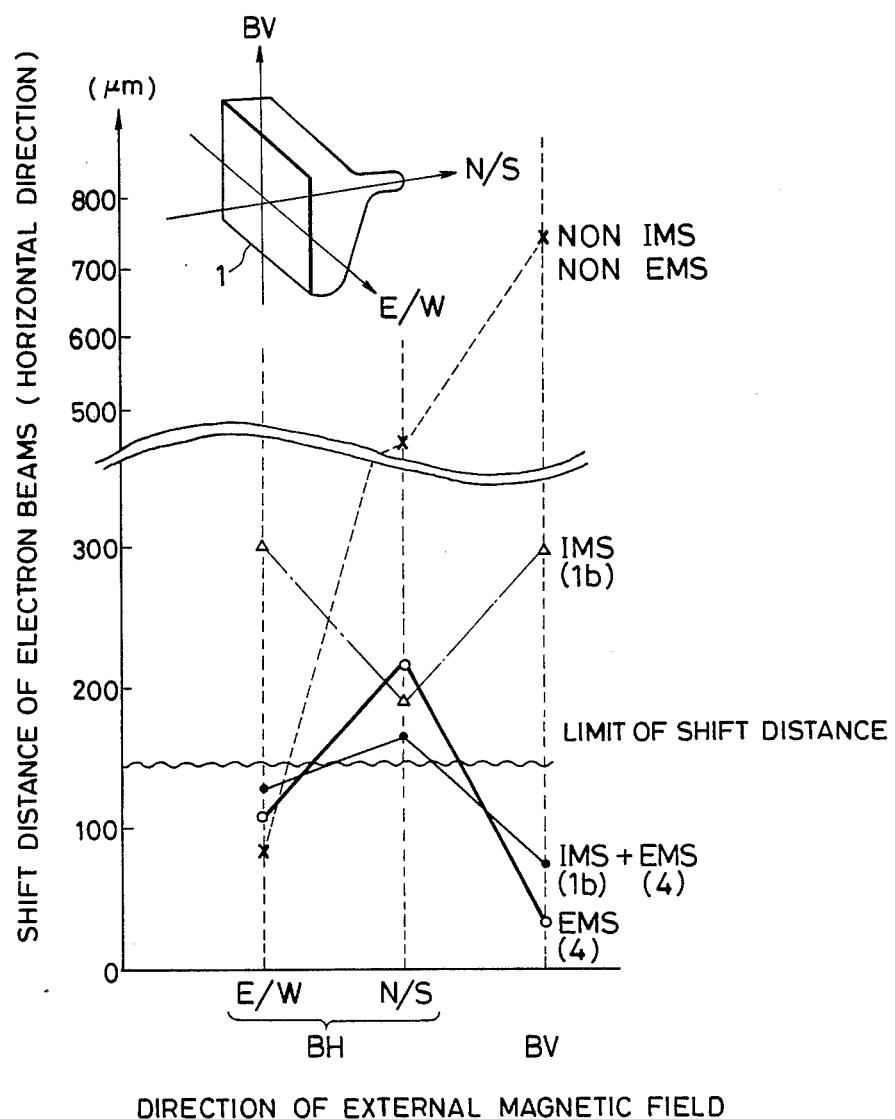
FIG. 2 is a diagram explaining the relationship between the kind of magnetic shielding system and the lateral shift distance of electron beams in a 110 deflection color CRT of 37 inches.

In the color CRT 1 shown in FIGS. 3A and 3B, as is apparent from FIG. 2, the shift distance of the electronic beam is remarkably reduced even in the case of the magnetic shielding system using only the EMS 4 when compared with the case of the magnetic shielding system using only the conventional IMS 1b. The shift distance is reduced to a value lower than the threshold shift distance (150 micrometers) particularly against the external magnetic field in both the E/W and BV directions. If the EMS 4 is combined with the conventional IMS 1b of FIG. 1A, the N/S shift distance is reduced even further. However, the shift distance of the electronic beam still somewhat exceeds the threshold shift quantity against an external magnetic field in the N/S direction. This is because there is a physical restriction that the front face (the screen where a picture is displayed) of the color CRT 1 cannot be covered by the magnetic shielding plate. The reason why the EMS 4 according to the present invention is effective against the external magnetic field in each of the E/W and BV directions, however, is believed to arise from the fact that, in such an arrangement, the EMS 4 may also cover the gap between the screen and the shadow of the color CRT 1. Particularly in a large-sized color CRT, the EMS 4 is extremely effective because the dimension of the gap is large.

Figure 4:
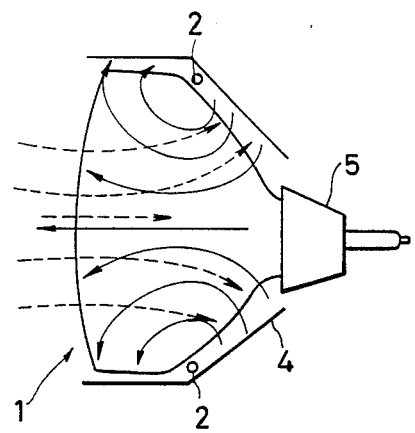
FIG. 4 is a view for explaining the operation of the magnetic shielding system of FIGS. 3A and 3B.

In the case of using the EMS 4, the magnetic shielding is insufficient and the shift distance of the electron beam exceeds the threshold distance for the external magnetic field in the N/S direction. To overcome this insufficiency in magnetic shielding, the electron beams can be effectively prevented from being shifted by placing the magnetic cancelling coil 2 inside the EMS 4 so as to annularly surround the outer circumference of the color CRT 1, as shown in FIGS. 3A and 3B. The cancelling coil 2 is wound around the CRT 1 by several tens of turns to several hundred turns, and the magnetic cancelling coil 2 is energized with a DC current to generate a cancelling magnetic field as indicate by solid lines in FIG. 4 to cancel the external magnetic field indicated by broken lines in FIG. 2 so as to provide a circumstance where no external magnetic field is left uncompensated. In such a system, the cancelling magnetic field can be extremely effectively generated by making the EMS 4 act as a magnetic core. For example, the quantity of current required to excite the magnetic cancelling coil 2 to sufficiently cancel an external magnetic field of 0.3 gauss in the N/S direction was 4 ampere-turns (AT). This value is about half of the quantity of current required to cancel an external magnetic field in the case of using only the IMS in the same manner, and this means that the ampere-turn efficiency is two times (four times in electric power efficiency) as much as using IMS alone.

As seen in FIG. 2, the magnetic shielding is sufficient against the external magnetic field in the BV direction. Against the external magnetic field in the E/W direction, the shift distance of an electron beam comes closer to the threshold thereof but there is no problem in magnetic shielding in practical use. In this case, correction can be made by providing a pair of the magnetic cancelling coils 3a and 3b opposed to each other on the side surface of the color CRT 1 between the color CRT 1 and the EMS 4, as shown in FIG. 3, and by exciting the pair of the magnetic cancelling coils 3a and 3b with a direct current. The placement of the cancelling coils 3a and 3b between the CRT 1 and the EMS 4 is similar to that of the main cancelling coil 2.

Similarly to the conventional system, it is necessary to separately provide another magnetic erasing function in the above-mentioned embodiment according to the present invention, the preferred embodiment having been described on the assumption that a magnetic erasing coil (not shown) is separately provided. However, the description of such a separately provided magnetic erasing coil has been omitted because the magnetic erasing coil has no direct relation with the present invention. Although the magnetic cancelling coil 2 and the magnetic erasing coil can be used in common, the description about it is omitted here. Further, the receiver falls within the present invention whether the IMS is provided or not.

Figure 5:
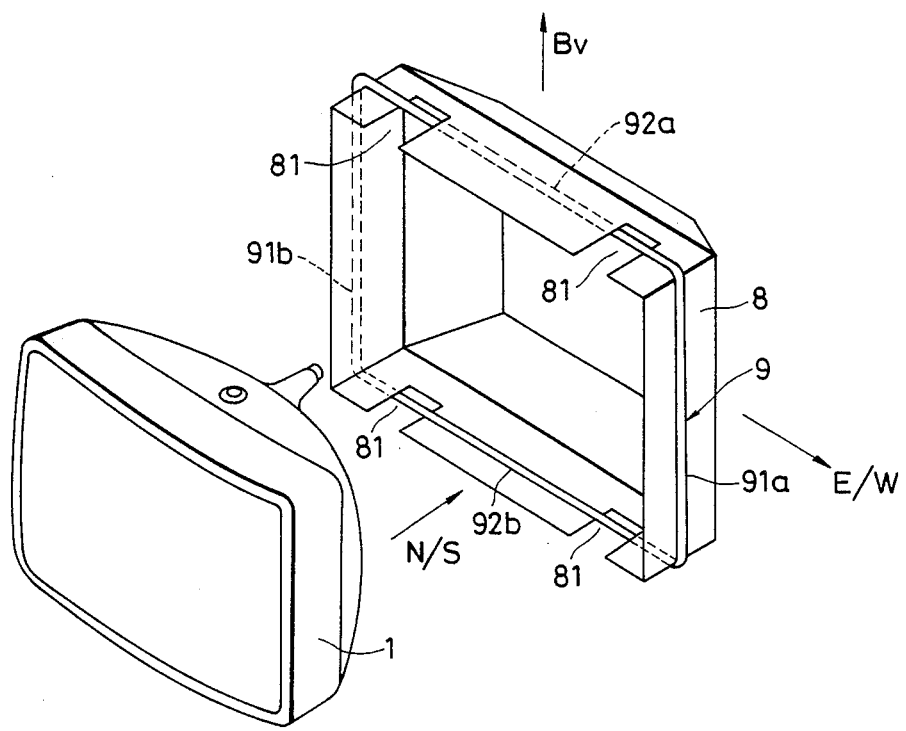
FIG. 5 is a perspective view showing another embodiment of the receiver.

FIG. 5 shows another embodiment of the present invention in which a magnetic cancelling coil is disposed inside a part of an EMS corresponding to a portion where strong cancelling correction is required while it is disposed outside another part of the EMS corresponding to another portion where only weak cancelling correction is required. Thereby, a desired shape distribution of cancelling magnetic field is obtained, in accordance with the shift distances of electron beams due to an external magnetic field in various positions in a picture screen of the color CRT.

In the embodiment of FIG. 5, notches 81 are formed in an outer circumferential wall of an EMS 8 at longitudinal side portions thereof. An N/S cancelling coil 9 is wound alternately inside and outside the EMS 8 with the notches 81 as boundaries of the alternation. In detail, the N/S cancelling coil 9 is arranged in such a manner that coil portions 91a and 91b corresponding to the opposite right and left sides (short sides) and to all corners of the picture screen of the color CRT 1 are disposed outside the EMS 8 while coil portions 92a and 92b corresponding to the upper and lower portions (long sides) of the picture screen are disposed inside the EMS 8.

The operations and effects of the above-mentioned arrangement will be described hereunder.

Figure 6:
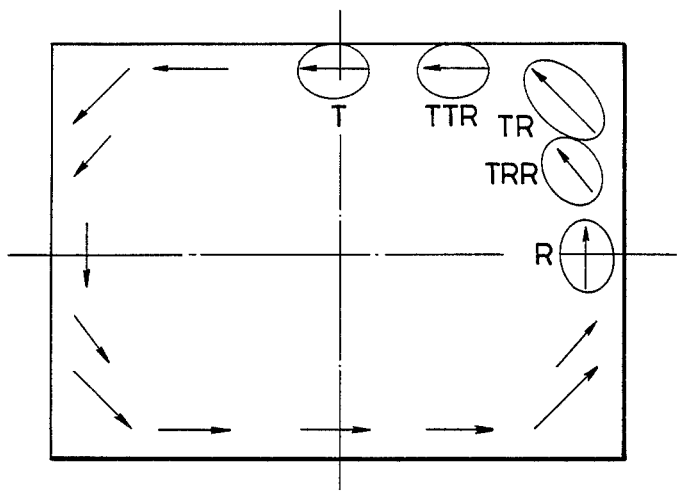
FIG. 6 is a view showing an example of beam shift owing to the influence of a magnetic field in the axial direction of the color CRT.
Figure 7:
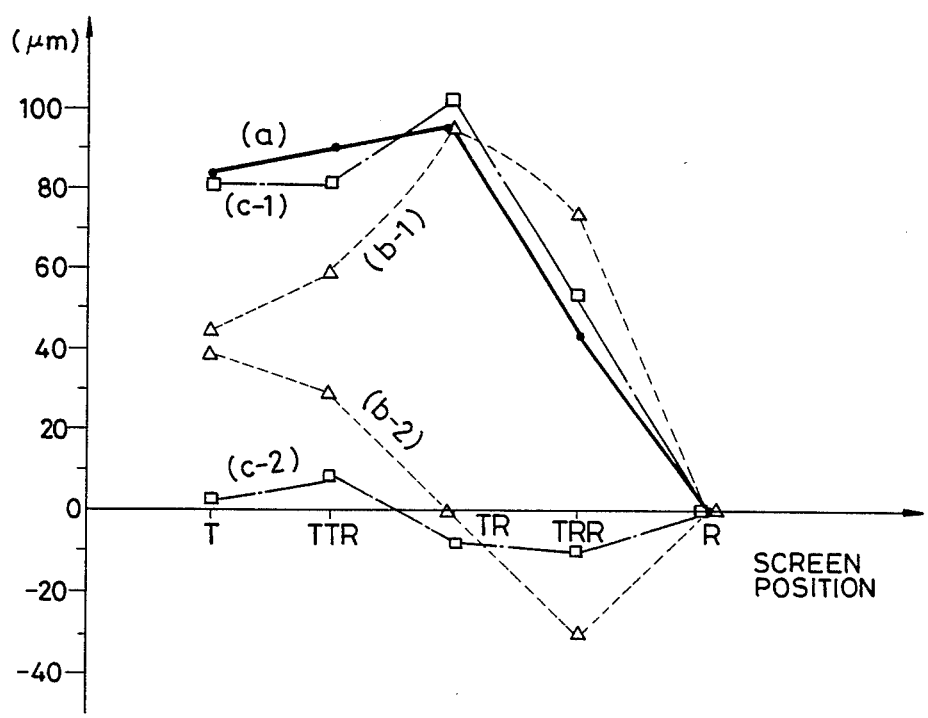
FIG. 7 is a graph for explaining an effect of the embodiment of FIG. 5 in connection with the shift distance of the electron beam.

As is known well, when the color CRT 1 is northerly disposed, the earth's magnetism causes an electron beam incident on the fluorescent screen in the picture face to rotationally shift as shown by arrows in FIG. 6, resulting in color shading and raster rotation. The degree of the shift of the beam depends not only on the deflection angle of the color CRT 1, the size of the CRT 1, the structure of the electron gun, etc., but also on positions on the picture face. FIG. 7 shows a specific example of the beam shift, and the graph of FIG. 7 is obtained by plotting the distance of beam shift on the fluorescent screen (quantity of target error) representing the respective points T, TTR, TR, TRR, and R in the first quadrant in the picture face of FIG. 6. In this example is plotted, in units of micrometers, the quantity of horizontal beam shift after the earth magnetism of 0.3 gauss was exerted axially onto a 37-inch 110 deflection color CRT of the stripe fluorescent screen type with the EMS 2 acting to compensate the magnetism.

In FIG. 7, a segmented line (a) shows the distance of the horizontal beam shift in the case where only the EMS 4 was used and the magnetic cancelling coils 2, 3a, and 3b shown in the embodiment of FIGS. 3A and 3B were removed. The segmented line (b-1) shows the quantity of cancelling correction produced by the embodiment of FIGS. 3A and 3B and segmented line (b-2) shows the quantity of remainder of correction or uncorrected shift, which is the difference between the segmented lines (a) and (b-1). That is, in the case where the cancelling coil 2 is excited by a current of a quantity necessary for completely correcting beam shift at the corner point TR in the picture face, that is, in the case where the quantity of correction is selected to be the value represented by the segmented line (b-1), it is found that the correction is insufficient at the points T and TTR in the picture face as seen from the segmented line (b-2), while the correction becomes excessive at the point TRR, as seen also from the same segmented line (b-2). In this case, the segmented line (b-1) showing the quantity of cancelling correction has a negative polarity opposite to that of the segmented line (a).

As to the embodiment in FIG. 5, on the other hand, a segmented line (c-1) shows the quantity of cancelling correction and a segmented line (c-2) shows the quantity of remainder of uncancelled beam shift. It is found that the uncancelled beam shift is reduced and the cancelling is performed to a substantially ideal degree in comparison with the segmented line (b-2) produced by the embodiment shown in FIGS. 3A and 3B. The reason is as follows.

A large cancelling magnetic field is generated inside the EMS 8 in the case where the coil 9 is disposed inside the EMS 8 with the EMS 8 acting as a magnetic core, that is, disposed on the inside, toward the color CRT 1, while a large cancelling magnetic field is generated outside the EMS 8 in the case where the coil 9 is arranged outside the EMS 8. That is to say, the cancelling magnetic field is applied to a less degree onto the color CRT 1 at portions where the coil 9 is disposed outside the EMS 8.

In the embodiment, description has been made of the method of cancelling magnetism by using only one cancelling coil 9 merely as an example of cancelling a magnetic field in the axis of tube. However, the number of the cancelling coil is not limited to one but may be any number and further it is a matter of course that the same concepts may be applied to the magnetic field in any other direction. Further, in the embodiment, description has been made as to the magnetic cancelling in the color CRT 1 having a stripe fluorescent screen. However, the same concepts may be applied also in a color CRT having a dot-structure fluorescent screen.

In the case where an undesirable external magnetic field is an alternating (AC) magnetic field, the cancelling can be performed by exciting the coil with a cancelling AC current corresponding to the alternating magnetic field.

The method of winding the cancelling coil 9 on the EMS 8 alternately inside and outside thereof may be asymmetrical between the top and bottom portions and between the right and left sides of the EMS 8, so long as the system may generate a desired magnetic field distribution which is enough to cancel the external magnetic field owing to the effect of magnetic core by the EMS 8.

What is claimed is:

1. A magnetic shield apparatus for use in shielding a cathode ray tube of a television receiver, said cathode ray tube having a funnel part and a panel part at a viewing side of said cathode ray tube with substantially flat sides, said apparatus comprising:
    an external magnetic shielding case substantially enclosing said funnel and major side portions of said panel part of said cathode ray tube;
    a toroidal magnetic cancelling coil applied with a constant current for cancelling an external magnetic field along a central axis of said cathode ray tube, wherein said toroidal magnetic cancelling coil is wound around said cathode ray tube; and
    a pair of magnetic cancelling coils applied with a constant current for cancelling an external magnetic field along major side portions of said panel part, being positioned on opposed sides of said cathode ray tube, and being arranged between said cathode ray tube and said external magnetic shielding case.

2. A magnetic shield apparatus for use in shielding a cathode ray tube of a television receiver, said cathode ray tube having a funnel part and a panel part at a viewing side of said cathode ray tube with substantially flat sides, said apparatus comprising:
    an external magnetic shielding case substantially enclosing said funnel part and major side portions of said panel part of said cathode ray tube;
    a magnetic cancelling coil applied with a constant current for cancelling an external magnetic field along a central axis of said cathode ray tube; and
    wherein said magnetic cancelling coil is a toroidal coil which is wound around said cathode ray tube and arranged to cross between an inside and an outside of said external magnetic shielding case.

3. A magnetic shield apparatus for use in shielding a cathode ray tube of a television receiver, said cathode ray tube having a funnel part and a panel part at a viewing side of said cathode ray tube with substantially flat sides, said apparatus comprising:
    an external magnetic shielding case substantially enclosing said funnel part and major side portions of said panel part of said cathode ray tube;
    a toroidal magnetic cancelling coil applied with a constant current for cancelling an external magnetic field along a central axis of said cathode ray tube, wherein said toroidal magnetic cancelling coil is wound around said cathode ray tube and is arranged between said cathode ray tube and said external magnetic shielding case; and a pair of magnetic cancelling coils applied with a constant current for cancelling an external magnetic field along major side portions of a panel part and being positioned on opposed sides of a cathode ray tube.

4. A magnetic shield apparatus for use in shielding a cathode ray tube of a television receiver, said cathode ray tube having a funnel part and a panel part at a viewing side of said cathode ray tube with substantially flat sides, said apparatus comprising:

an external magnetic shielding case substantially enclosing said funnel part and major side portions of said panel part of said cathode ray tube;

a toroidal magnetic cancelling coil applied with a constant current for cancelling an external magnetic field along a central axis of said cathode ray tube, wherein said toroidal magnetic cancelling coil is wound around said cathode ray tube and is arranged to cross between an inside and an outside of said external magnetic shielding case; and a pair of magnetic cancelling coils applied with a constant current for cancelling an external magnetic field along major side portions of a panel part and being positioned on opposed sides of a cathode ray tube.

5. A magnetic shield apparatus for use in shielding a cathode ray tube of a television receiver, said cathode ray tube having a funnel part and a panel part at a viewing side of said cathode ray tube with substantially flat sides, said apparatus comprising:

an external magnetic shielding case having cuts made in a surrounding surface thereof and substantially enclosing said funnel part and major side portions of said panel part of said cathode ray tube;

a toroidal magnetic cancelling coil applied with a constant current for cancelling an external magnetic field along a central axis of said cathode ray tube, and which is wound around said cathode ray tube and crosses between an inside and an outside of said external magnetic shielding case through said cuts; and a pair of magnetic cancelling coils applied with a constant current for cancelling an external magnetic field along major side portions of a panel part and being positioned on opposed sides of a cathode ray tube.

6. A magnetic shield apparatus as claimed in claim 5, wherein said toroidal coil is applied with a constant direct current.

7. A magnetic shield apparatus as claimed in claim 5, wherein said toroidal coil is applied with a constant alternating current.

8. A magnetic shield apparatus for use in shielding a cathode ray tube of a television receiver, said cathode ray tube having a funnel part and a panel part at a viewing side of said cathode ray tube, said apparatus comprising:

an external magnetic shielding case enclosing said funnel part and major side portions of said panel part of said cathode ray tube;

a toroidal magnetic cancelling coil applied with a constant current for cancelling an external magnetic field along a central axis of said cathode ray tube, and wherein said toroidal magnetic cancelling coil is wound around said cathode ray tube at least partially inside said external magnetic shielding case; and a pair of magnetic cancelling coils applied with a constant current for cancelling an external magnetic field along major side portions of a panel part and being positioned on opposed sides of said cathode ray tube, and being arranged between said cathode ray tube and said external magnetic shielding case.

9. A magnetic shield apparatus as claimed in claim 8, wherein said cathode ray tube further has flat sides, and said external magnetic shielding case encloses said flat sides.

10. A magnetic shield apparatus as claimed in claim 8, wherein said external magnetic shielding case substantially encloses said funnel and major side portions.

* * * * *